United States Patent
Cheng et al.

(10) Patent No.: US 11,205,382 B2
(45) Date of Patent: Dec. 21, 2021

(54) SENSING CIRCUIT FOR OLED DRIVER AND OLED DRIVER USING THE SAME

(71) Applicant: NOVATEK Microelectronics Corp., Hsin-Chu (TW)

(72) Inventors: Jhih-Siou Cheng, New Taipei (TW); Po-Yu Tseng, Taoyuan (TW); Keko-Chun Liang, Hsinchu (TW); Ju-Lin Huang, Hsinchu County (TW); Chih-Hsien Chou, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 58 days.

(21) Appl. No.: 16/198,864

(22) Filed: Nov. 22, 2018

(65) Prior Publication Data

US 2020/0168154 A1    May 28, 2020

(51) Int. Cl.
  *G09G 3/32*  (2016.01)
  *G09G 3/3258*  (2016.01)
  *H01L 27/32*  (2006.01)
  *H01L 27/12*  (2006.01)

(52) U.S. Cl.
  CPC ....... *G09G 3/3258* (2013.01); *H01L 27/1214* (2013.01); *H01L 27/3209* (2013.01); *G09G 2300/0842* (2013.01); *G09G 2310/0294* (2013.01)

(58) Field of Classification Search
  CPC ................. G09G 3/32; G09G 3/3258; G09G 2300/0294; H01L 27/1214; H01L 27/3209
  See application file for complete search history.

(56) References Cited

U.S. PATENT DOCUMENTS

| | | | | |
|---|---|---|---|---|
| 4,857,863 A | * | 8/1989 | Ganger | H03F 3/3001 330/264 |
| 2007/0052452 A1 | * | 3/2007 | Chou | G11C 27/024 327/94 |
| 2007/0279335 A1 | | 12/2007 | Lin | |
| 2013/0002040 A1 | * | 1/2013 | Morishita | H01L 27/08 307/104 |
| 2014/0145775 A1 | * | 5/2014 | Turner | H01L 27/0255 327/310 |
| 2015/0131188 A1 | | 5/2015 | Yao | |
| 2015/0262634 A1 | * | 9/2015 | Choi | G11C 5/147 365/189.05 |
| 2016/0078805 A1 | * | 3/2016 | Woo | G09G 3/3225 345/78 |
| 2016/0125811 A1 | * | 5/2016 | Park | G09G 3/3258 345/694 |

(Continued)

FOREIGN PATENT DOCUMENTS

| CN | 1058659 A | 2/1992 |
|---|---|---|
| CN | 101437341 A | 5/2009 |

(Continued)

*Primary Examiner* — Chanh D Nguyen
*Assistant Examiner* — Nguyen H Truong
(74) *Attorney, Agent, or Firm* — Winston Hsu (57) ABSTRACT

A sensing circuit for an organic light-emitting diode (OLED) driver includes a sample and hold circuit and a clamping circuit. The sample and hold circuit includes a capacitor. The clamping circuit, coupled to the sample and hold circuit, is configured to clamp a sensing voltage received by the sample and hold circuit to conform to a withstand voltage of the capacitor.

10 Claims, 9 Drawing Sheets

(56) References Cited

U.S. PATENT DOCUMENTS

2019/0128939 A1 * 5/2019 O'Donnell ........... G01R 31/002

FOREIGN PATENT DOCUMENTS

| | | |
|---|---|---|
| CN | 101542571 A | 9/2009 |
| CN | 101753004 A | 6/2010 |
| CN | 102375465 A | 3/2012 |
| CN | 202632722 U | 12/2012 |
| CN | 103137072 A | 6/2013 |
| CN | 103236237 A | 8/2013 |
| CN | 203243226 U | 10/2013 |
| CN | 103702496 A | 4/2014 |
| CN | 203536946 U | 4/2014 |
| CN | 104094341 A | 10/2014 |
| CN | 105427796 A | 3/2016 |
| CN | 105575332 A | 5/2016 |
| CN | 205356729 U | 6/2016 |
| CN | 107204611 A | 9/2017 |
| CN | 107301840 A | 10/2017 |
| CN | 206946907 U | 1/2018 |
| JP | 2000-339958 A | 12/2000 |
| TW | 200822706 | 5/2008 |
| TW | 200824443 | 6/2008 |
| TW | 201347530 A | 11/2013 |
| WO | 2013/143307 A1 | 10/2013 |

\* cited by examiner

SENSING CIRCUIT FOR OLED DRIVER AND OLED DRIVER USING THE SAME

BACKGROUND OF THE INVENTION

1. Field of the Invention

The present invention relates to a sensing circuit for an organic light-emitting diode (OLED) driver, and more particularly, to a sensing circuit for the OLED driver which is capable of sensing parameters of pixel elements in an OLED panel.

2. Description of the Prior Art

An organic light-emitting diode (OLED) is a light-emitting diode (LED) in which the emissive electroluminescent layer is a film of organic compound, where the organic compound emits light in response to an electric current. OLEDs are widely used in displays of electronic devices such as television screens, computer monitors, and portable systems such as mobile phones, handheld game consoles and personal digital assistants (PDAs). An active matrix OLED (AMOLED), which is driven by a thin-film transistor (TFT) and contains a storage capacitor that maintains the pixel states to enable large size and large resolution displays, becomes the mainstream of the OLED panels.

Figure 1:
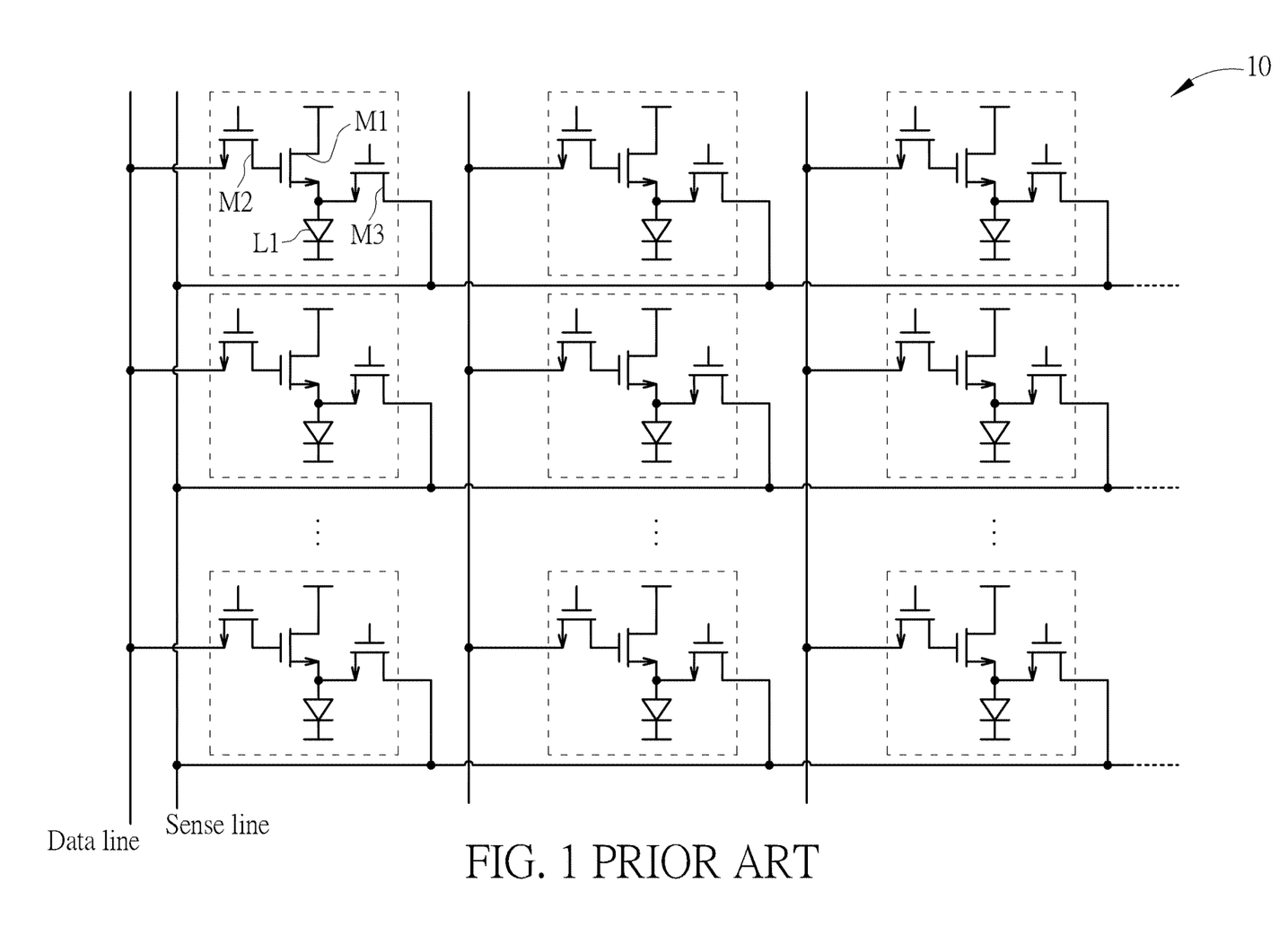
FIG. 1 is a schematic diagram of the structure of a common OLED panel.

In a general OLED panel, each pixel cell includes three subpixels, each of which has an OLED with one of the three primary colors, for composing a target color to be displayed in the pixel cell. A subpixel receives a voltage signal from a driver integrated circuit (IC). A TFT then converts the voltage signal into a driving current, which drives the OLED to emit light. FIG. 1 illustrates the structure of a common OLED panel 10, where three TFTs M1-M3 and one OLED L1 are included in each subpixel. The luminance of the OLED L1 is determined by the driving current of the OLED, where the driving current is generated and converted from the driving TFT M1, and the TFTs M2 and M3 are served as switches for forwarding signals. However, in the OLED panel 10, the driving TFT M1 in different subpixels may possess an error or mismatch in the device parameter, which may result in different voltage-to-current conversion behaviors. In addition, there may also be a mismatch in the luminous efficiency of the OLED L1. After a long-time operation, the OLED panel 10 may undergo degradations in voltage-to-current conversion and luminous efficiency. Therefore, the uniformity of the OLED panel 10 may be influenced since different locations on the OLED panel 10 may possess different levels of degradations.

Figure 2:
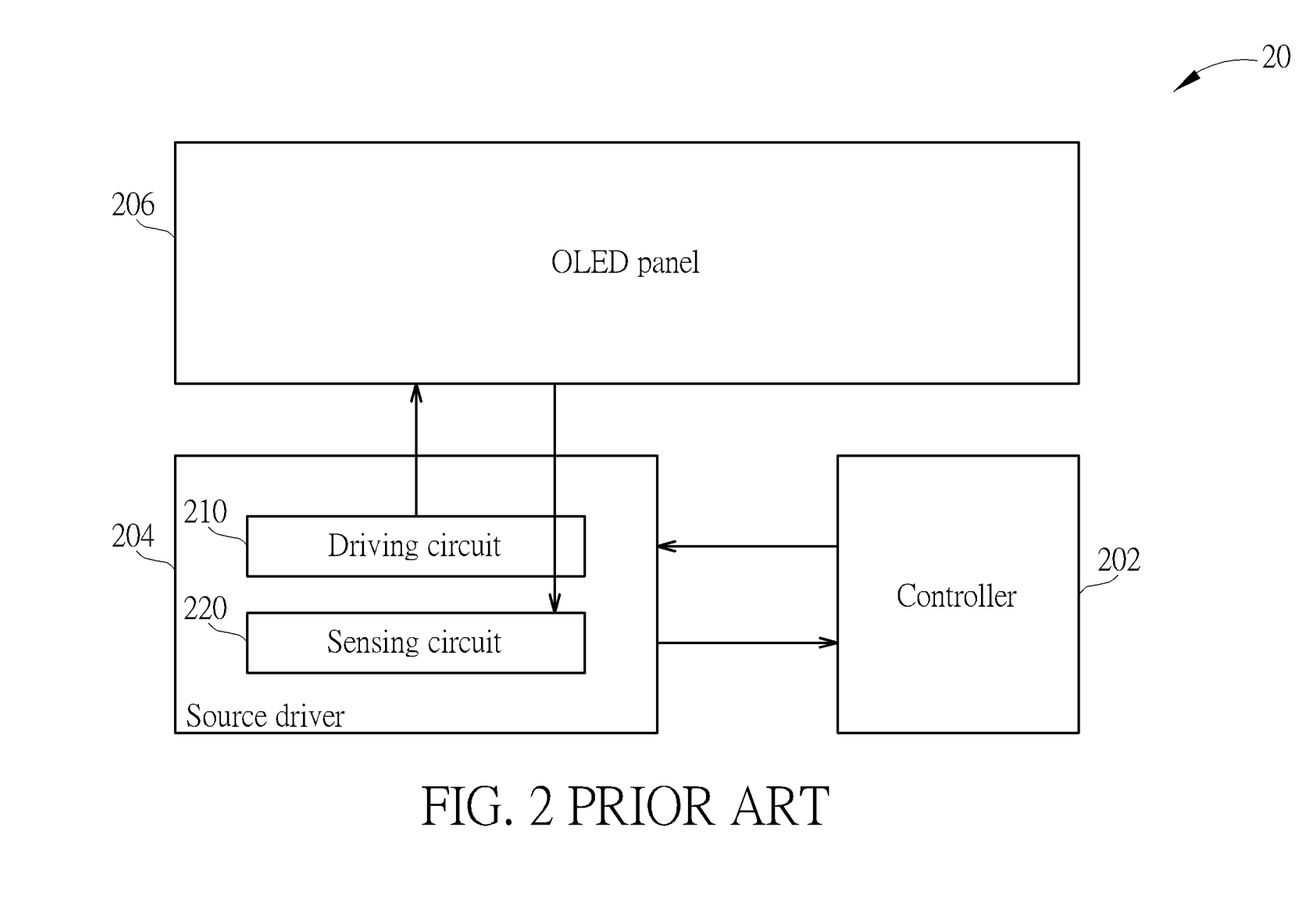
FIG. 2 is a schematic diagram of a common OLED control system.

In order to improve the uniformity of the OLED panel, the source driver is usually equipped with a sensing circuit responsible for sensing the degrading level of the parameters such as the luminous efficiency of the OLED and/or the device parameters of the TFT. Please refer to FIG. 2, which is a schematic diagram of a common OLED control system 20. The OLED control system 20 includes a controller 202, a source driver 204 and an OLED panel 206. The controller 202 may be implemented as a system on a chip (SOC), for outputting display data and performing the sensing operation for the OLED panel 206. The source driver 204 includes a driving circuit 210 and a sensing circuit 220. The sensing scheme is that the driving circuit 210 transmits a driving signal to a target subpixel on the OLED panel 206 and the sensing circuit 220 correspondingly receives a sensing voltage from the subpixel. An analog to digital converter at the receiving end is applied to receive the sensing voltage. In order to reduce noise interferences, the sensing circuit 220 may further include a capacitor array. With increasing demands of large-scale panels, the quantity of subpixels in the OLED panel becomes more and more; hence, the sensing circuit 220 is required to include a great number of capacitors to realize the sensing functions. The great number of capacitors occupy a large circuit area and thus require higher circuit costs.

In consideration of the cost issue, the capacitors may be disposed to be adaptive to a smaller range of sensing voltages that may be generated from the subpixels. For example, an OLED panel operates by receiving a power supply voltage VDDA, e.g., 18V, and the sensing operation on the OLED panel generates a sensing voltage ranging from 3V-6V normally. Thus, the operating voltage range within $\Delta 3V$ may be enough for the capacitors in normal operations, where the capacitors are usually adaptive to a voltage stress which is capable of receiving the voltages between 3V-6V. However, the panel defect may result in an unpredictable sensing voltage transmitted to the sensing circuit. This unpredictable sensing voltage may reach up to the power supply voltage 18V or down to the ground voltage 0V, causing the capacitor in the sensing circuit to be burnt out. Thus, in the conventional source driver, it is required that the capacitors having a high withstand voltage capable of receiving the voltages ranging from 0V to 18V are disposed, and the increasing withstand voltage proportionally increases the area of the capacitors.

Thus, there is a need for improvement over the prior art.

SUMMARY OF THE INVENTION

It is therefore an objective of the present invention to provide a sensing circuit for an organic light-emitting diode (OLED) driver, where the capacitor in the sensing circuit may be protected, to prevent an unpredictably high or low sensing voltage from being received by the capacitor.

An embodiment of the present invention discloses a sensing circuit for an OLED driver. The sensing circuit comprises a sample and hold circuit and a clamping circuit. The sample and hold circuit comprises a capacitor. The clamping circuit, coupled to the sample and hold circuit, is configured to clamp a sensing voltage received by the sample and hold circuit to conform to a withstand voltage of the capacitor.

Another embodiment of the present invention discloses an OLED driver, which comprises a driving circuit and a sensing circuit. The driving circuit is configured to transmit a driving signal to an OLED panel. The sensing circuit is configured to receive a sensing voltage from the OLED panel in response to the driving signal. The sensing circuit comprises a sample and hold circuit and a clamping circuit. The sample and hold circuit comprises a capacitor. The clamping circuit, coupled to the sample and hold circuit, is configured to clamp the sensing voltage to conform to a withstand voltage of the capacitor.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
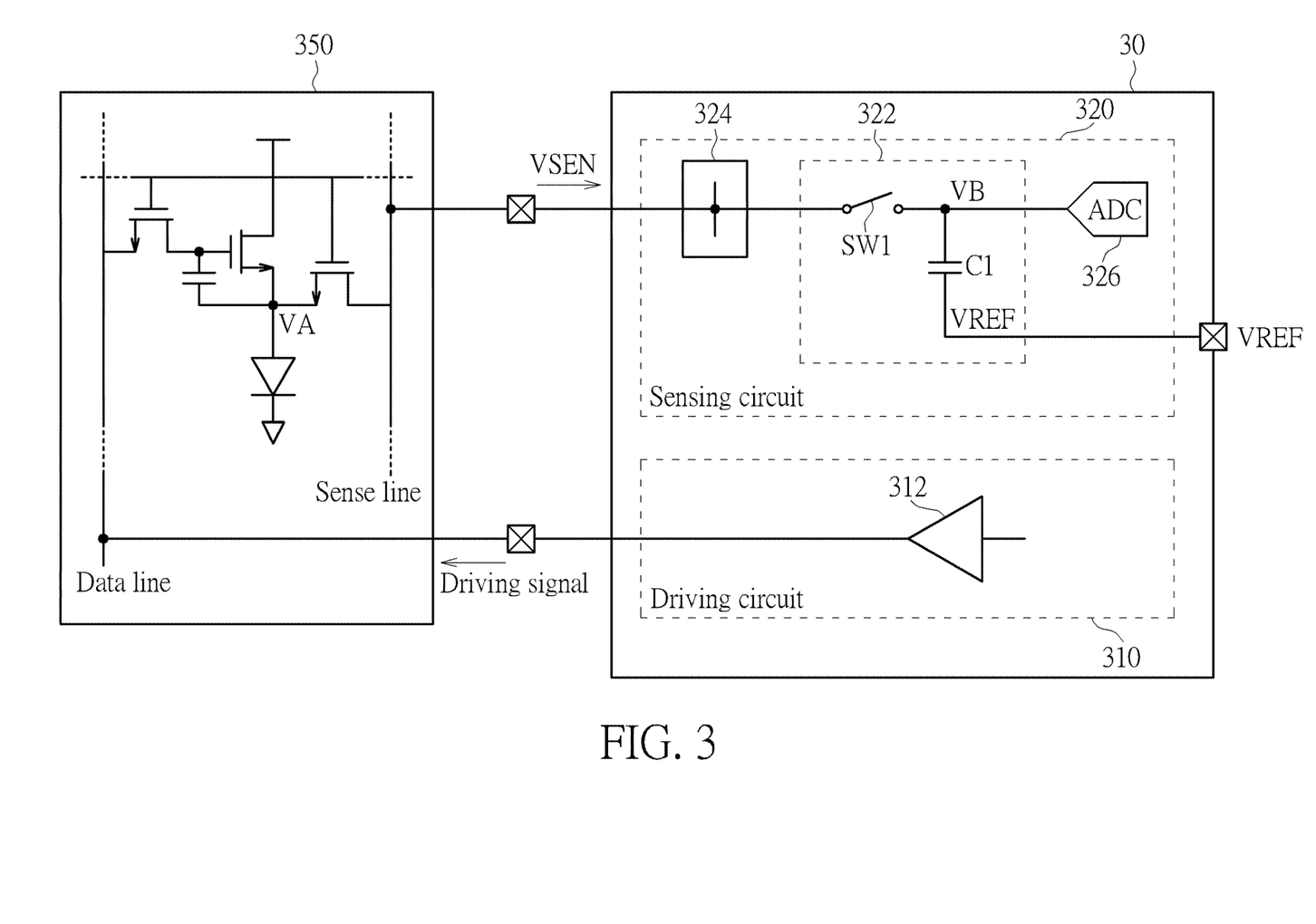
FIG. 3 is a schematic diagram of a source driver according to an embodiment of the present invention.

FIG. 3 is a schematic diagram of a source driver 30 according to an embodiment of the present invention. The source driver 30 includes a driving circuit 310 and a sensing circuit 320. A subpixel 350 of an organic light-emitting diode (OLED) panel is not included in the source driver 30 but illustrated in FIG. 3 to facilitate the illustration. As shown in FIG. 3, the subpixel 350 includes an OLED and three transistors (e.g., thin-film transistors (TFTs)) and one capacitor as a 3T1C structure. Those skilled in the art should understand that the present invention is applicable to an OLED panel having any structure and that shown in FIG. 3 is one of various implementations of the subpixel structure.

The driving circuit 310 includes an output driver 312, for outputting display data to the subpixel 350 during the display period. During the sensing period, the driving circuit 310 is configured to transmit a driving signal to the data line of the subpixel 350. The sensing circuit 320 is configured to receive a sensing voltage VSEN from the subpixel 350 via the sense line, in response to the driving signal. The sensing circuit 320 includes a sample and hold circuit 322, a clamping circuit 324 and an analog to digital converter (ADC) 326. The sample and hold circuit 322 includes a switch SW1 and a capacitor C1. In general, the voltage on the node VA of the subpixel 350 is sensed and received by the sensing circuit 320. The sensing voltage VSEN, which reflects the parameters to be sensed in the subpixel, may pass through the clamping circuit 324 and then be sampled by the switch SW1 to be transmitted to the node VB. The ADC 326 then converts the sensing voltage VSEN into a corresponding digital data after the sensing voltage VSEN is sampled by the sample and hold circuit 322 and held in the node VB.

The capacitor C1 is configured to stabilize the sensing voltage VSEN on the node VB. As mentioned above, the conventional capacitor should have a high withstand voltage capable of receiving the voltages ranging from ground to the power supply voltage, to be adaptive to abnormal conditions such as the panel defect; hence, a large circuit area is required for the conventional capacitor. In comparison, the present invention allows the usage of capacitors with a lower withstand voltage, so as to reduce the circuit area and thereby reduce the circuit cost. As shown in FIG. 3, the clamping circuit 324 is configured to clamp the sensing voltage VSEN to a normal voltage level predicted to be received from the subpixel 350, and the normal voltage level may conform to the withstand voltage of the capacitor C1. In other words, the withstand voltage of the capacitor C1 only needs to be adaptive to a smaller range of sensing voltages, which reduces the area of the capacitor C1.

In detail, a terminal of the capacitor C1 is coupled to a reference terminal for receiving a reference voltage VREF, and another terminal of the capacitor C1 is coupled to the node VB for receiving the sensing voltage VSEN. The clamping circuit 324 may clamp the sensing voltage VSEN to let the difference between the received sensing voltage VSEN in the node VB and the reference voltage VREF to be within the withstand voltage of the capacitor C1, where the withstand voltage is the maximum voltage stress across the capacitor C1 that may be tolerable by the capacitor C1. In this embodiment, the reference voltage VREF is received from an external voltage source via the reference terminal such as an input pad of the source driver 30; while in another embodiment, the reference voltage VREF may be generated by a reference generator included in the source driver 30.

Figure 4:
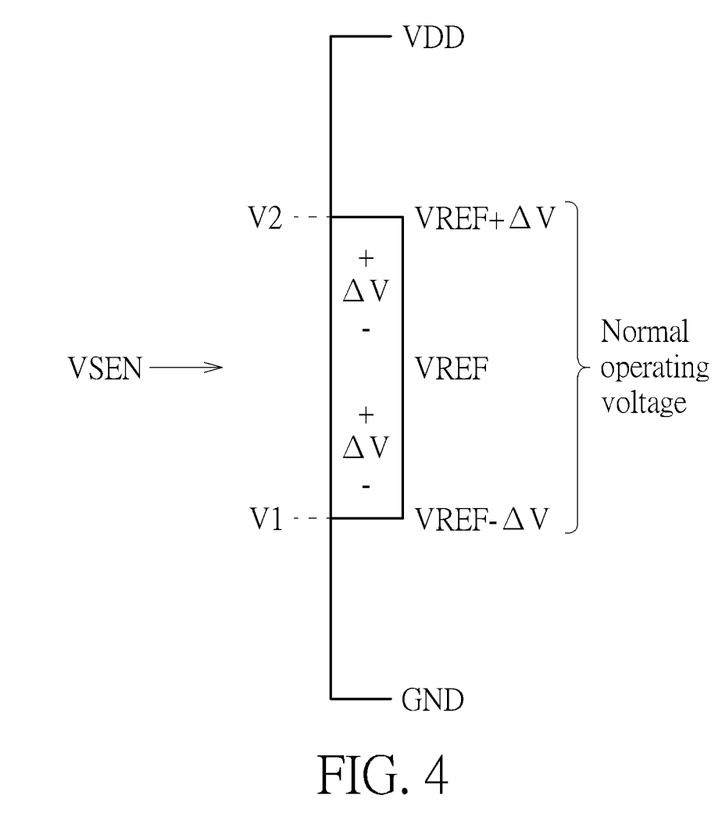
FIG. 4 is a schematic diagram of an operating voltage range of the source driver according to an embodiment of the present invention.

Please refer to FIG. 4, which is a schematic diagram of an operating voltage range of the source driver 30 according to an embodiment of the present invention. The source driver 30 may operate by receiving a power supply voltage VDD and a ground voltage GND, which are respectively the maximum and minimum operating voltage of the source driver 30. In a normal condition, the sensing voltage VSEN received from the OLED panel may be within a range between V1 and V2; hence, the reference voltage VREF may be configured to be between V1 and V2, and the withstand voltage of the capacitor C1 may be configured to be a voltage difference ΔV. The voltage difference ΔV may be equal to or slightly larger than the difference between the reference voltage VREF and the voltage V1, and may be equal to or slightly larger than the difference between the reference voltage VREF and the voltage V2. Therefore, the sensing voltage VSEN received by the capacitor C1 is within the range of the reference voltage VREF plus and minus the voltage difference ΔV under normal operations, to conform to the withstand voltage of the capacitor C1.

In an abnormal condition, a panel defect such as a defect point or detect line may appear, such that an unpredictable sensing voltage may be outputted from a defective subpixel of the panel. This unpredictable sensing voltage may reach up to the power supply voltage VDD or down to the ground voltage GND. The clamping circuit 324 may prevent the unpredictable sensing voltage VSEN from being received by the capacitor C1. In an embodiment, the clamping circuit 324 may clamp the sensing voltage VSEN to be lower than an upper limit equal to the reference voltage VREF plus the voltage difference ΔV, and/or clamp the sensing voltage VSEN to be higher than a lower limit equal to the reference voltage VREF minus the voltage difference ΔV. Therefore, the sensing voltage VSEN received by the capacitor C1 is forced to be within the predefined range, which avoids that the voltage stress across the capacitor C1 exceeds the withstand voltage of the capacitor C1 to burn out the capacitor C1.

Therefore, with the clamping circuit 324, the sensing voltage VSEN received by the capacitor C1 is limited to be within the normal operating range of the capacitor C1. The capacitor C1 may be implemented with a smaller area corresponding to a lower withstand voltage. Note that the sensing circuit 320 of the source driver 30 may include hundreds or thousands of channels, and each channel has a sample and hold circuit with a capacitor for receiving sensing voltages from a column of subpixels on the OLED panel; hence, the reduction of capacitor area in every channel leads to a great amount of improvement on the circuit area and circuit cost of the source driver 30.

In addition, the ADC 326 in the sensing circuit 320 only needs to support a voltage range conforming to the normal operating voltage of the capacitor C1 or the voltage limit clamped by the clamping circuit 324, which is much smaller than the operating voltage range VDD-GND of the source driver 30. This leads to lower power consumption and simpler design of the ADC 326. In an embodiment, the configurations of the ADC 326 and the clamping circuit 324 are controlled to be adaptive to various applications, e.g., different types of OLED panels and/or different system voltages. The operating range of the ADC 326 may be configured to conform to the sensing voltage VSEN that may be received from the OLED panel in a normal condition, and the size of the capacitor C1 (corresponding to a specific withstand voltage) and the upper/lower limit of the clamping circuit 324 are adjusted accordingly.

Figure 5:
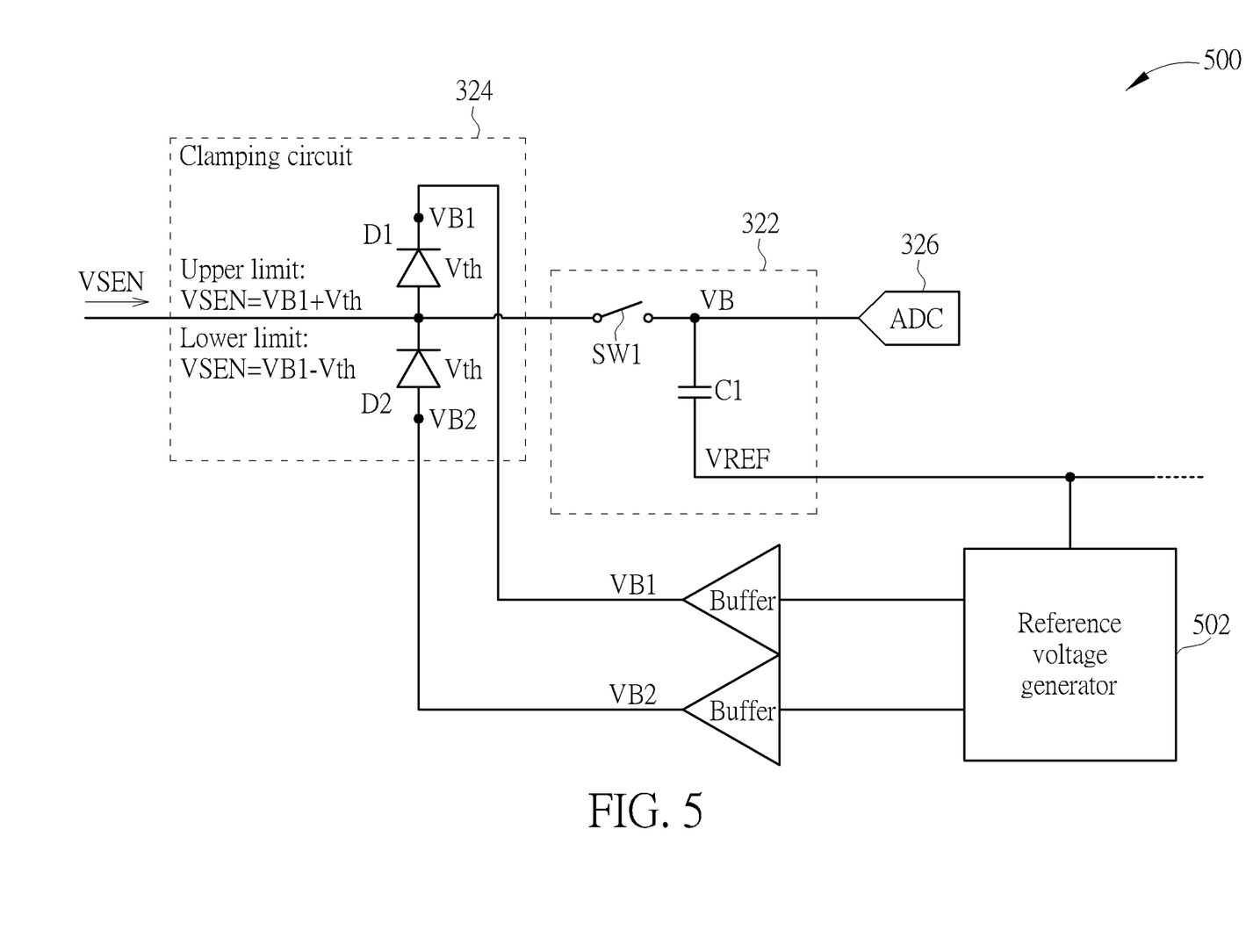
FIGS. 5-8 are schematic diagrams of a sensing circuit with a detailed implementation of the clamping circuit.

The clamping circuit of the present invention may be realized by any methods. Please refer to FIG. 5, which is a schematic diagram of a sensing circuit 500 with a detailed implementation of the clamping circuit. The structure of the sensing circuit 500 is similar to the structure of the sensing circuit 320, and the signals and elements having similar functions are denoted by the same symbols. As shown in FIG. 5, the clamping circuit 324 includes two diodes D1 and D2, which receive bias voltages VB1 and VB2, respectively. The sensing circuit 500 further includes a reference voltage generator 502, configured to output the reference voltage VREF to the capacitor C1. The reference voltage generator 502 may also generate the bias voltages VB1 and VB2, and respectively output the bias voltages VB1 and VB2 to the diodes D1 and D2. The diodes D1 and D2 have a threshold voltage Vth. Therefore, the received sensing voltage VSEN is clamped by the diode D1 as being limited to be smaller than the level of VB1 plus Vth if the sensing voltage VSEN tends to exceed this upper limit, and clamped by the diode D2 as being limited to be greater than the level of VB2 minus Vth if the sensing voltage VSEN tends to fall below this lower limit. The reference voltage generator 502 may generate the bias voltages VB1 and VB2 according to the reference voltage VREF, so as to control the upper and lower limits appropriately based on the withstand voltage of the capacitor C1. As a result, if an unpredictably high or low sensing voltage VSEN enters the source driver 30, the clamping circuit 324 may limit the sensing voltage VSEN received by the sample and hold circuit 322 to be within a predetermined range, so as to prevent the capacitor C1 in the sample and hold circuit 322 from being burnt out.

Figure 6:
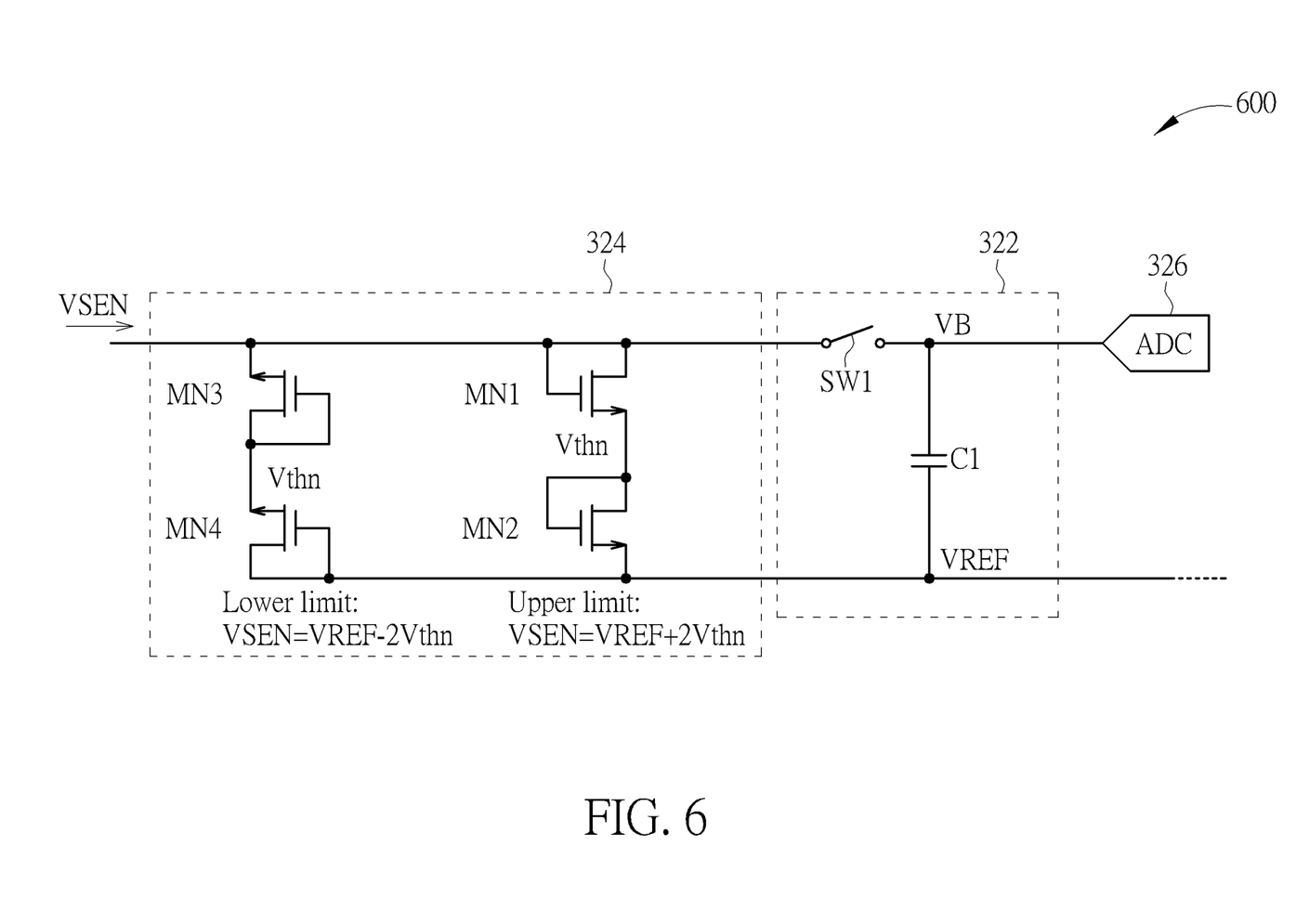

Please refer to FIG. 6, which is a schematic diagram of a sensing circuit 600 with another detailed implementation of the clamping circuit. The structure of the sensing circuit 600 is similar to the structure of the sensing circuit 320, and the signals and elements having similar functions are denoted by the same symbols. As shown in FIG. 6, the clamping circuit 324 includes NMOS transistors MN1-MN4, each of which is connected as a diode-connected structure, and each of the NMOS transistors MN1-MN4 has a threshold voltage Vthn. The NMOS transistors MN1-MN2 are connected between the input terminal of the sensing circuit 600 and the reference terminal, to clamp the sensing voltage VSEN to be smaller than the level of the reference voltage VREF plus two threshold voltages 2×Vthn (as the summation of the threshold voltage Vthn of MN1 and the threshold voltage Vthn of MN2) if the sensing voltage VSEN tends to exceed this upper limit. The NMOS transistors MN3-MN4 are connected between the input terminal of the sensing circuit 600 and the reference terminal, to clamp the sensing voltage VSEN to be greater than the level of the reference voltage VREF minus two threshold voltages 2×Vthn (as the summation of the threshold voltage Vthn of MN3 and the threshold voltage Vthn of MN4) if the sensing voltage VSEN tends to fall below this lower limit. Note that the upper and lower limits of the clamped sensing voltage VSEN are determined based on the number of transistors connected in series; hence, the number of transistors may be adjusted so as to generate a desired upper/lower limit. For example, three or more transistors may be connected in series between the input terminal and the reference terminal, to increase the adaptive range of the sensing voltage VSEN.

Figure 7:
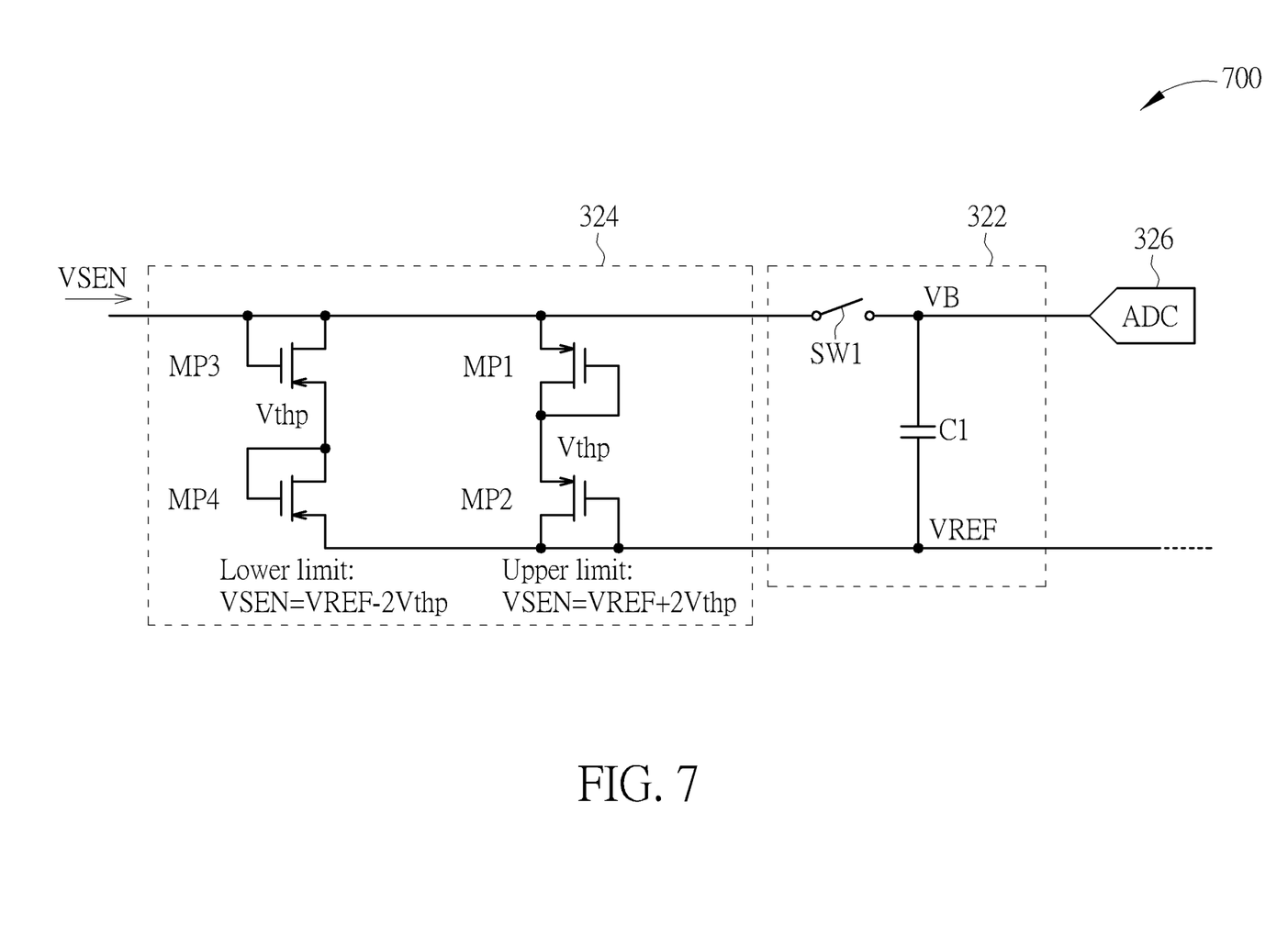

FIG. 7 illustrates a sensing circuit 700 with another detailed implementation of the clamping circuit 324. The structure of the sensing circuit 700 is similar to the structure of the sensing circuit 600, and the signals and elements having similar functions are denoted by the same symbols. The sensing circuit 700 differs from the sensing circuit 600 in that, the clamping circuit 324 in the sensing circuit 700 is implemented with 4 PMOS transistors MP1-MP4. The clamping functions may be realized with the PMOS transistors MP1-MP4 in a manner similar to the operations of NMOS transistors illustrated in the above paragraph, which are omitted herein for brevity. In another embodiment, combination of NMOS transistor(s) and PMOS transistor(s) is also feasible to implement the clamping circuit of the present invention.

Figure 8:
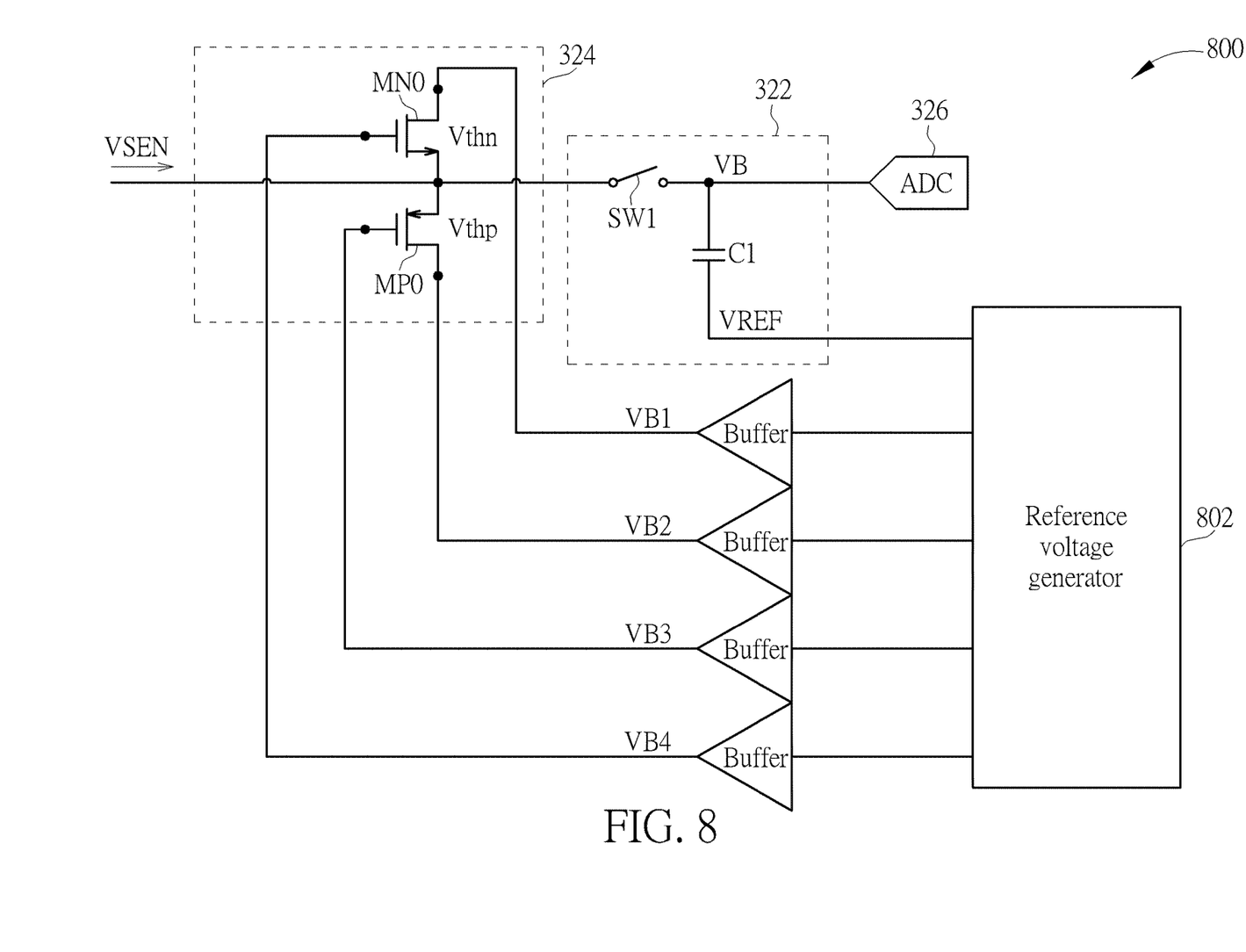

Please refer to FIG. 8, which is a schematic diagram of a sensing circuit 800 with another detailed implementation of the clamping circuit 324. The structure of the sensing circuit 800 is similar to the structure of the sensing circuit 320, and the signals and elements having similar functions are denoted by the same symbols. As shown in FIG. 8, the clamping circuit 324 includes an NMOS transistor MN0 and a PMOS transistor MP0 respectively receive bias voltages VB1-VB4. The bias voltages VB1-VB4 are configured to determine the upper limit and lower limit of the clamped sensing voltage VSEN. The sensing circuit 800 further includes a reference voltage generator 802, for generating the bias voltages VB1-VB4 based on the reference voltage VREF. With well control of the bias voltages VB1-VB4 and the reference voltage VREF, the upper and lower limits may be determined appropriately, to conform to the withstand voltage of the capacitor C1.

Please note that the present invention aims at providing a sensing circuit for an OLED driver, where a clamping circuit is applied to clamp the received sensing voltage, allowing the voltage received by the capacitor in the sample and hold circuit to fall within a safe range, so that the capacitor with a lower withstand voltage and a smaller area is applicable in the OLED driver. Those skilled in the art may make modifications and alternations accordingly. For example, the structure of the clamping circuit may be realized in any manners, such as the embodiments illustrated in FIGS. 5-8 and any other possible variations. Since the clamping circuit is responsible for protecting the capacitor in the sample and hold circuit to prevent the capacitor from being burnt out, the clamping circuit may be disposed in any position before the capacitor.

Figure 9:
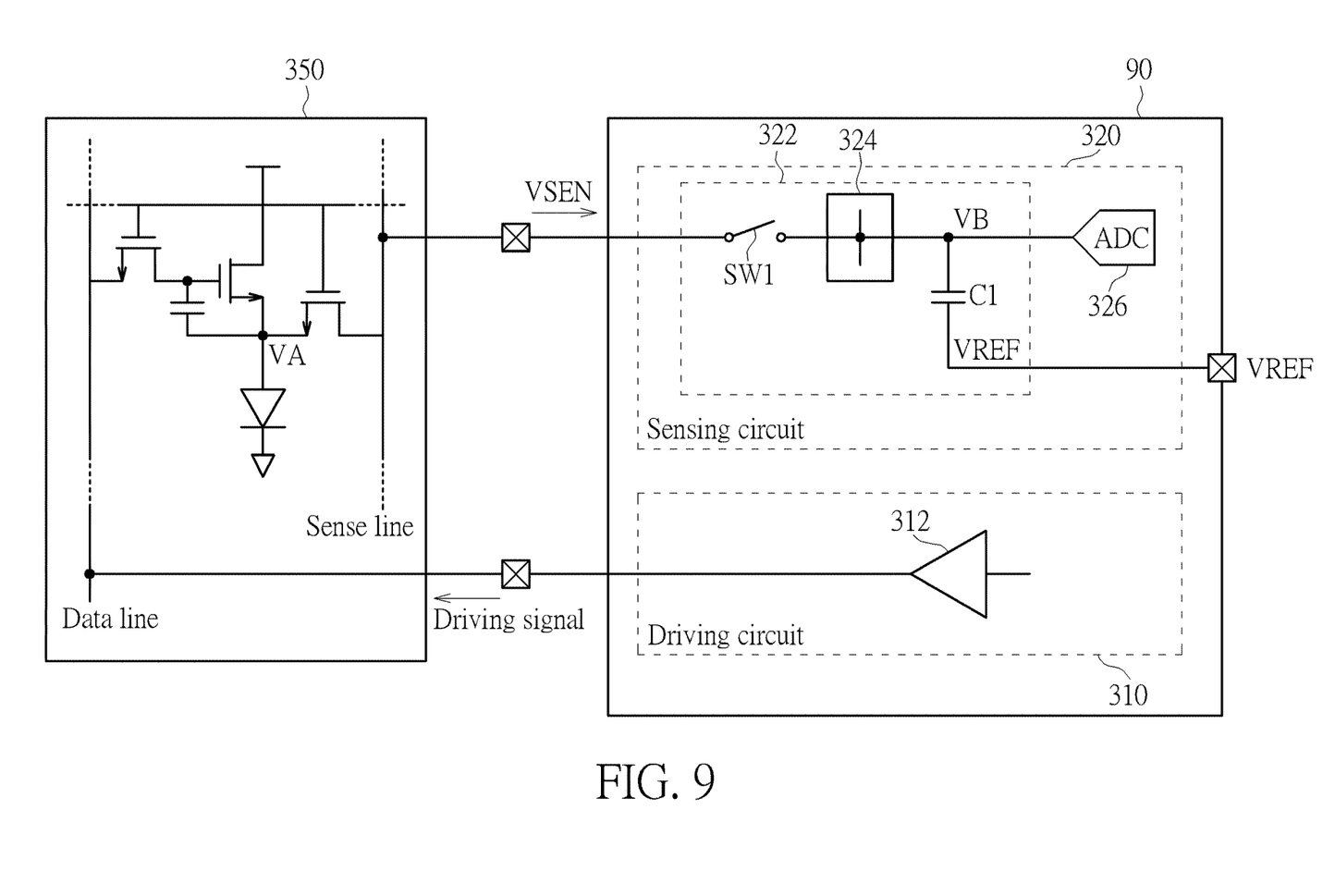
FIG. 9 is a schematic diagram of another source driver according to an embodiment of the present invention.

Please refer to FIG. 9, which is a schematic diagram of another source driver 90 according to an embodiment of the present invention. The structure of the source driver 90 is similar to the structure of the source driver 30, and the signals and elements having similar functions are denoted by the same symbols. As shown in FIG. 9, the source driver 90 differs from the source driver 30 in that, the clamping circuit 324 of the source driver 90 is coupled between the switch SW1 and the capacitor C1 of the sample and hold circuit 322. The clamping circuit 324 shown in FIG. 9 may also realize the clamping functions shown above, and may be implemented with the structures as described in the above paragraphs.

To sum up, the present invention provides a sensing circuit for an OLED source driver which is capable of sensing parameters of pixel elements in an OLED panel. The sensing circuit includes a clamping circuit for clamping the received sensing voltage, allowing the voltage received by the capacitor in the sample and hold circuit to conform to the withstand voltage of the capacitor. Therefore, in the present invention, the capacitor having a lower withstand voltage may be applied, which occupies a smaller area in comparison with the capacitors applied in the conventional OLED driver. Therefore, the circuit cost may be reduced, and the clamping circuit prevents the capacitor from being burnt out due to an unpredictably high or low voltage when a panel defect occurs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sensing circuit for an organic light-emitting diode (OLED) driver, comprising:
   a sample and hold circuit, comprising a capacitor; and
   a clamping circuit, coupled to the sample and hold circuit, configured to clamp a sensing voltage received by the sample and hold circuit to conform to a withstand voltage of the capacitor, to clamp a cross voltage of the capacitor to be within a voltage range tolerable to the capacitor;
   wherein a first terminal of the capacitor receives the sensing voltage and a second terminal of the capacitor receives a reference voltage, and the sensing voltage is clamped to let a difference between the sensing voltage and the reference voltage to be within the withstand voltage of the capacitor;
   wherein the reference voltage is set to a median voltage level within a normal operating range of the capacitor.

2. The sensing circuit of claim 1, further comprising:
   an analog to digital converter (ADC), coupled to the sample and hold circuit, configured to convert the sensing voltage after the sensing voltage is sampled by the sample and hold circuit.

3. The sensing circuit of claim 2, wherein an operating range of the ADC conforms to the normal operating range of the capacitor.

4. The sensing circuit of claim 1, wherein the clamping circuit comprises:
   a diode, configured to clamp the sensing voltage to be smaller than a first bias voltage plus a threshold voltage of the diode, or clamp the sensing voltage to be greater than a second bias voltage minus the threshold voltage of the diode.

5. The sensing circuit of claim 4, further comprising:
   a reference voltage generator, configured to output a reference voltage to the capacitor and generate the first bias voltage and the second bias voltage according to the reference voltage.

6. The sensing circuit of claim 1, wherein the clamping circuit comprises:
   at least one transistor, coupled between an input terminal of the sensing circuit and a reference terminal, configured to clamp the sensing voltage to be smaller than a reference voltage of the reference terminal plus a summation of at least one threshold voltage of the transistor, or clamp the sensing voltage to be greater than the reference voltage of the reference terminal minus the summation of the threshold voltage of the transistor.

7. The sensing circuit of claim 6, wherein the at least one transistor comprises at least one NMOS transistor or at least one PMOS transistor.

8. The sensing circuit of claim 6, wherein the at least one transistor comprises at least one diode-connected transistor.

9. An organic light-emitting diode (OLED) driver, comprising:
   a driving circuit, configured to transmit a driving signal to an OLED panel, and
   a sensing circuit, configured to receive a sensing voltage from the OLED panel in response to the driving signal, the sensing circuit comprising:
     a sample and hold circuit, comprising a capacitor; and
     a clamping circuit, coupled to the sample and hold circuit, configured to clamp the sensing voltage to conform to a withstand voltage of the capacitor, to clamp a cross voltage of the capacitor to be within a voltage range tolerable to the capacitor;
   wherein a first terminal of the capacitor receives the sensing voltage and a second terminal of the capacitor receives a reference voltage, and the sensing voltage is clamped to let a difference between the sensing voltage and the reference voltage to be within the withstand voltage of the capacitor;
   wherein the reference voltage is set to a median voltage level within a normal operating range of the capacitor.

10. A sensing method for an organic light-emitting diode (OLED) driver, comprising:
    transmitting a driving signal to an OLED panel;
    receiving a sensing voltage from the OLED panel in response to the driving signal; and
    clamping the sensing voltage to conform to a withstand voltage of a capacitor of the OLED driver, to clamp a cross voltage of the capacitor to be within a voltage range tolerable to the capacitor;
    wherein a first terminal of the capacitor receives the sensing voltage and a second terminal of the capacitor receives a reference voltage, and the sensing voltage is clamped to let a difference between the sensing voltage and the reference voltage to be within the withstand voltage of the capacitor;
    wherein the reference voltage is set to a median voltage level within a normal operating range of the capacitor.

* * * * *